(12) United States Patent
Gan

(10) Patent No.: US 10,211,232 B2
(45) Date of Patent: Feb. 19, 2019

(54) MANUFACTURE METHOD OF ARRAY SUBSTRATE AND ARRAY SUBSTRATE MANUFACTURED BY THE METHOD

(71) Applicant: Shenzhen China Star Optoelectronics Technology Co., Ltd., Shenzhen (CN)

(72) Inventor: Qiming Gan, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 165 days.

(21) Appl. No.: 15/105,581

(22) PCT Filed: Apr. 8, 2016

(86) PCT No.: PCT/CN2016/078876
§ 371 (c)(1),
(2) Date: Jun. 17, 2016

(87) PCT Pub. No.: WO2017/147973
PCT Pub. Date: Sep. 8, 2017

(65) Prior Publication Data
US 2018/0097015 A1  Apr. 5, 2018

(30) Foreign Application Priority Data

Mar. 1, 2016 (CN) .......................... 2016 1 0116254

(51) Int. Cl.
*H01L 29/15* (2006.01)
*H01L 27/12* (2006.01)
(Continued)

(52) U.S. Cl.
CPC .............. *H01L 27/124* (2013.01); *C23F 1/18* (2013.01); *C23F 1/34* (2013.01); *G02F 1/1362* (2013.01);
(Continued)

(58) Field of Classification Search
CPC .............. H01L 27/124; H01L 27/1259; H01L 27/1463; H01L 29/41733; H01L 29/786; C23F 1/18; C23F 1/34; G02F 1/1362
(Continued)

(56) References Cited

U.S. PATENT DOCUMENTS

| 7,782,426 B2* | 8/2010 | Tanno ............... G02F 1/134363 349/110 |
| 2009/0103025 A1* | 4/2009 | Tanno ............... G02F 1/134363 349/110 |
| 2015/0060973 A1* | 3/2015 | Tsai .................. G02F 1/136213 257/309 |

FOREIGN PATENT DOCUMENTS

CN        101419371 A    4/2009

* cited by examiner

*Primary Examiner* — Tu-Tu V Ho
(74) *Attorney, Agent, or Firm* — Leong C. Lei

(57) ABSTRACT

The present invention provides a manufacture method of an array substrate and an array substrate manufactured by the method. By sequentially forming the first passivation layer and the flat layer, and then implementing patterning process and anneal process to the flat layer, in the anneal process to the flat layer, the flat layer and the source/the drain cannot contact with each other due to the first passivation layer inbetween, and thus, no reaction of generating complex happens, which is beneficial for promoting the electrical property of the array substrate and realizing the signal conduction; in comparison with prior art, the present invention can decrease at least one mask in advance, which is a advantage to raise the process result, to decrease the process time and to reduce the production cost. In the array substrate, the signal transmission is smooth, and the substrate possesses the great electrical property.

5 Claims, 4 Drawing Sheets

(51) Int. Cl.
    *G02F 1/1362*     (2006.01)
    *C23F 1/18*     (2006.01)
    *C23F 1/34*     (2006.01)
    *H01L 27/146*     (2006.01)
    *H01L 29/417*     (2006.01)
    *H01L 29/786*     (2006.01)
    *G02F 1/1333*     (2006.01)

(52) U.S. Cl.
    CPC .. *G02F 1/133345* (2013.01); *G02F 1/136227* (2013.01); *H01L 27/1259* (2013.01); *H01L 27/1463* (2013.01); *H01L 29/41733* (2013.01); *H01L 29/786* (2013.01); *G02F 2201/50* (2013.01)

(58) Field of Classification Search
    USPC ........................................................ 257/72
    See application file for complete search history.

MANUFACTURE METHOD OF ARRAY SUBSTRATE AND ARRAY SUBSTRATE MANUFACTURED BY THE METHOD

FIELD OF THE INVENTION

The present invention relates to a display technology field, and more particularly to a manufacture method of an array substrate and an array substrate manufactured by the method.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a CF (Color Filter) substrate, a TFT (Thin Film Transistor) array substrate, a LC (Liquid Crystal) sandwiched between the CF substrate and the TFT array substrate and sealant.

FIG. 1 is a diagram of a manufacture method of an array substrate according to prior art. The manufacture method of the array substrate comprises steps of:

step 1, providing a substrate 100, and sequentially forming a gate (not shown), a gate isolation layer 200, and active layer (not shown) and a source/a drain 30 on the substrate 100;

step 2, forming a passivation layer 400 on the source/the drain 30 and the gate isolation layer 200, and patterning the passivation layer 400 to obtain a first via 410 on the passivation layer 400;

step 3, forming a flat layer 500 on the passivation layer 400, and patterning the flat layer 500 to obtain a second via 510 in the first via 410; and then implementing anneal process to the flat layer 500;

step 4, forming a common electrode 600 on the flat layer 500;

step 5, forming a second passivation layer 700 on the common electrode 600, the flat layer 500, and patterning the second passivation layer 700 to obtain a third via 710 in the second via 510;

step 6, forming a pixel electrode 800 on the second passivation layer 700, and the pixel electrode 800 contacts with the source/the drain 30 through the third via 710.

In the aforesaid step 3 of the manufacture method of the array substrate, as implementing anneal process to the flat layer 500, the photoresist material of the flat layer 500 in the first via 410 will react with the metal material of the source/the drain 30, and generate the nonconducting complex 550, and then to block the conduction of the pixel electrode 800 and the source/the drain 30, which results in that the data signal (Data) cannot be transmitted to the pixel electrode 800. Accordingly, the performance of the array substrate can be significantly influenced.

SUMMARY OF THE INVENTION

An objective of the present invention is to provide a manufacture method of an array substrate, which can effectively block the contact of the flat layer and the source/the drain to prevent the generation of the nonconducting complex in the flat layer in the anneal process, which is beneficial for promoting the electrical property of the array substrate and realizing the signal conduction; meanwhile, the amount of the masks is decreased to decrease the process time and to reduce the production cost.

Another objective of the present invention is to provide an array substrate, in which the signal transmission is smooth, and the substrate possesses the great electrical property.

For realizing the aforesaid objectives, the present invention provides a manufacture method of an array substrate, comprising steps of:

step 1, providing a substrate, and sequentially forming a gate, a gate isolation layer, an active layer and a source/a drain on the substrate;

step 2, forming a first passivation layer on the source/the drain and the gate isolation layer, and forming a flat layer on the first passivation layer, and patterning the flat layer to obtain a first via above the source/the drain;

step 3, depositing a first transparent conductive layer on the flat layer, and patterning the first transparent conductive layer to form a common electrode;

step 4, forming a second passivation layer on the common electrode and the flat layer, and the second passivation layer covers the first via and contact with the first passivation layer;

implementing via opening process to a portion of the second passivation layer at a bottom of the first via to obtain a second via on the second passivation layer, and continuing etching the first passivation layer along the second via to obtain a third via corresponding to the second via, and thus, sizes of the second via and the third via are smaller than a size of the first via;

step 5, depositing a second transparent conductive layer on the second passivation layer, and patterning to the second transparent conductive layer to form a pixel electrode, and the pixel electrode contacts with the source/the drain through the second via and the third via.

Materials and film thicknesses of the first passivation layer and the second passivation layer are the same.

The first passivation layer and the second passivation layer are Silicon Oxide layers, Silicon Nitride layers or composite layers superimposed with Silicon Oxide layers and Silicon Nitride layers; film thicknesses of the first passivation layer and the second passivation layer are 1500-2500 Å.

Sizes of the second via and the third via are smaller than a size of the first via.

All the first via, the second via and the third via are circular holes, and a diameter of the first via is 7-12 μm, and diameters of the second via and the third via are 3-5 μm.

The present invention further provides an array substrate, comprising a substrate, a gate located on the substrate, a gate isolation layer located on the gate and the substrate, and an active layer located on the gate isolation layer, a source/a drain located on the active layer and the gate isolation layer, a first passivation layer located on the source/the drain, the active layer and the gate isolation layer, a flat layer located on the first passivation layer, a common electrode located on the flat layer, a second passivation layer located on the common electrode and the flat layer, and a pixel electrode located on the second passivation layer;

a first via located on the flat layer correspondingly above the source/the drain, a second via located on the second passivation layer on a bottom portion of the first via, a third via located on the first passivation layer communicating with the second via, and the pixel electrode contacts with the source/the drain through the second via and the third via.

Materials and film thicknesses of the first passivation layer and the second passivation layer are the same.

The first passivation layer and the second passivation layer are Silicon Oxide layers, Silicon Nitride layers or composite layers superimposed with Silicon Oxide layers and Silicon Nitride layers; film thicknesses of the first passivation layer and the second passivation layer are 1500-2500 Å.

Sizes of the second via and the third via are smaller than a size of the first via.

All the first via, the second via and the third via are circular holes, and a diameter of the first via is 7-12 μm, and diameters of the second via and the third via are 3-5 μm.

The present invention further provides an array substrate, comprising a substrate, a gate located on the substrate, a gate isolation layer located on the gate and the substrate, and an active layer located on the gate isolation layer, a source/a drain located on the active layer and the gate isolation layer, a first passivation layer located on the source/the drain, the active layer and the gate isolation layer, a flat layer located on the first passivation layer, a common electrode located on the flat layer, a second passivation layer located on the common electrode and the flat layer, and a pixel electrode located on the second passivation layer;

a first via located on the flat layer correspondingly above the source/the drain, a second via located on the second passivation layer on a bottom portion of the first via, a third via located on the first passivation layer communicating with the second via, and the pixel electrode contacts with the source/the drain through the second via and the third via;

wherein materials and film thicknesses of the first passivation layer and the second passivation layer are the same;

wherein the first passivation layer and the second passivation layer are Silicon Oxide layers, Silicon Nitride layers or composite layers superimposed with Silicon Oxide layers and Silicon Nitride layers; film thicknesses of the first passivation layer and the second passivation layer are 1500-2500 Å;

wherein sizes of the second via and the third via are smaller than a size of the first via.

The benefits of the present invention are: the present invention provides a manufacture method of an array substrate. By sequentially forming the first passivation layer and the flat layer, and then implementing patterning process and anneal process to the flat layer, in the anneal process to the flat layer, the flat layer and the source/the drain cannot contact with each other due to the first passivation layer inbetween, and Thus, no reaction of generating complex happens, which is beneficial for promoting the electrical property of the array substrate and realizing the signal conduction; in comparison with the manufacture of the array substrate according to prior art, the present invention can decrease at least one mask in advance, which is a advantage to raise the process result, to decrease the process time and to reduce the production cost. In the array substrate manufactured by the method according to the present invention, the signal transmission is smooth, and the substrate possesses the great electrical property.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
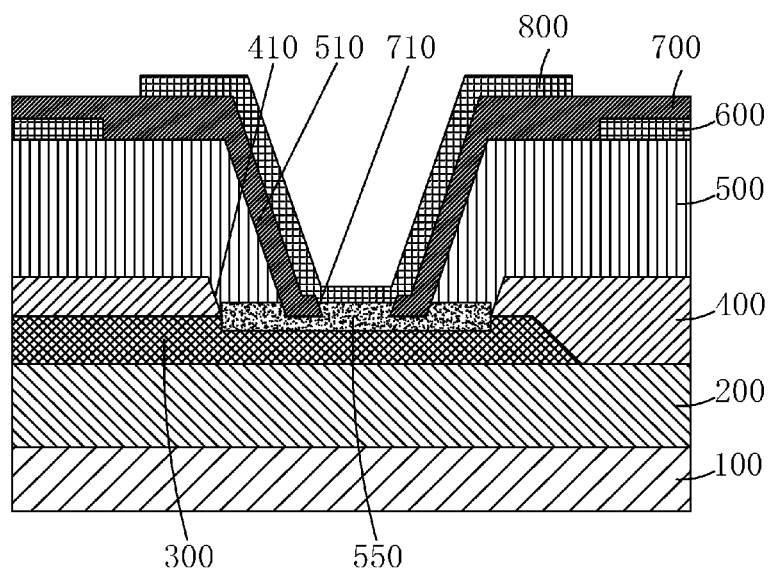
FIG. 1 is a diagram of a manufacture method of an array substrate according to prior art.
Figure 2:
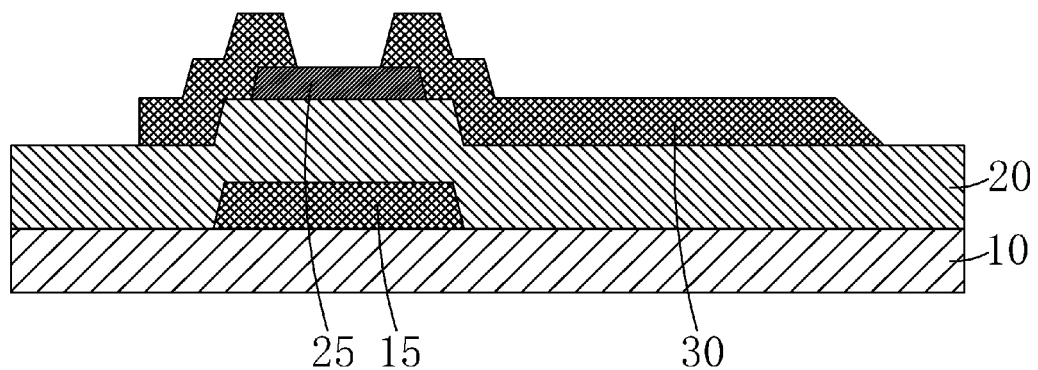
FIG. 2 is a diagram of the step 1 of a manufacture method of an array substrate according to the present invention.

Please refer to FIGS. 2-7, the present invention provides a manufacture method of an array substrate, comprising steps of:

step 1, as shown in FIG. 2, providing a substrate 10, sequentially forming a gate 15, a gate isolation layer 20, an active layer 25 and a source/a drain 30 on the substrate 10.

Specifically, the substrate 10 is a transparent substrate, and preferably is a glass substrate.

Specifically, material of the gate 15, the source/the drain 30 can be a stack combination of one or more of molybdenum (Mo), titanium (Ti), aluminum (Al) and copper (Cu). Material of the source/the drain 30 is preferably to be copper.

Specifically, the gate isolation layer 20 can be silicon oxide layers ($SiO_x$), silicon nitride layers ($SiN_x$) or composite layers superimposed with the silicon oxide layers and the silicon nitride layers.

Figure 3:
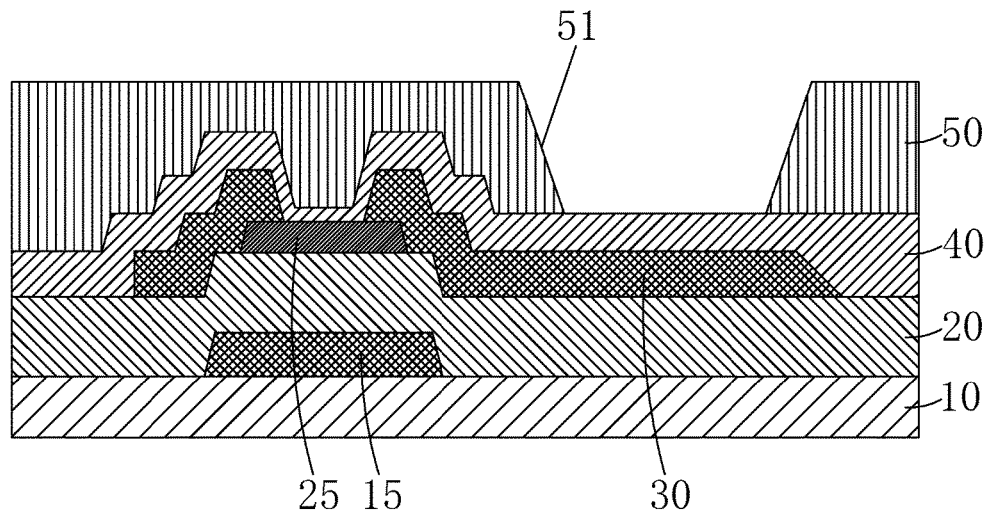
FIG. 3 is a diagram of the step 2 of a manufacture method of an array substrate according to the present invention.

Specifically, material of the active layer 25 is IGZO (Indium Gallium Zinc Oxide).

step 2, as shown in FIG. 3, forming a first passivation layer 40 on the source/the drain 30 and the gate isolation layer 20, and forming a flat layer 50 on the first passivation layer 40, and employing one mask to implement exposure, development to the flat layer 50 for patterning the flat layer 50 to obtain a first via 51 above the source/the drain 30.

Specifically, material of the flat layer 50 is positive photoresist.

Figure 4:
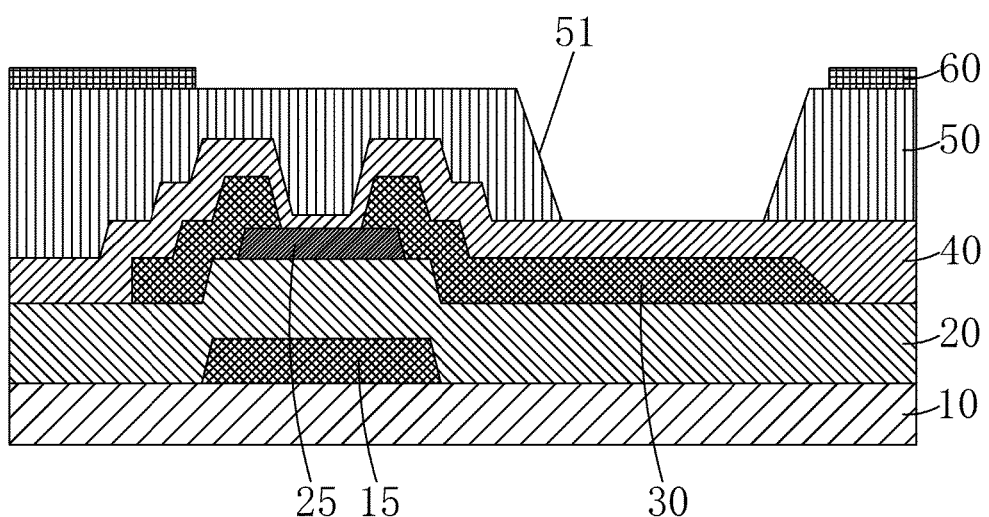
FIG. 4 is a diagram of the step 3 of a manufacture method of an array substrate according to the present invention.

Specifically, the step 2 further comprises after forming the first via 51 on the flat layer 50, implementing anneal process to the flat layer 50 to heat and solidify the same. As implementing anneal process to the flat layer 50, the flat layer 50 and the source/the drain 30 cannot contact with each other due to the first passivation layer 40 inbetween. Thus, no reaction of generating complex happens.

step 3, as shown in FIG. 4, depositing a first transparent conductive layer on the flat layer 50, and implementing one photolithographic process for patterning the first transparent conductive layer to form a common electrode 60.

Specifically, material of the common electrode 60 is transparent conductive metal oxide, such as Indium Tin Oxide (ITO).

Figure 5:
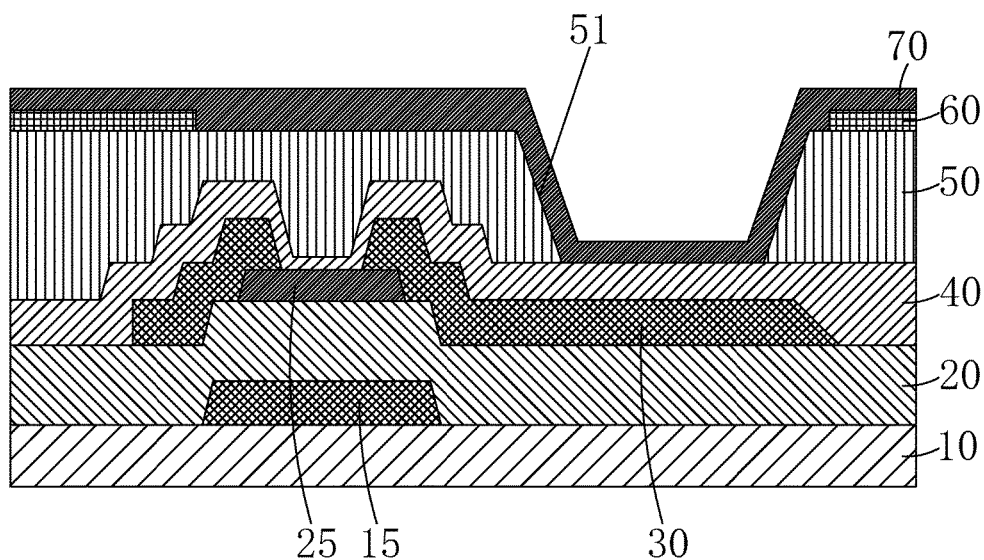
FIGS. 5-6 are diagrams of the step 4 of a manufacture method of an array substrate according to the present invention.
Figure 6:
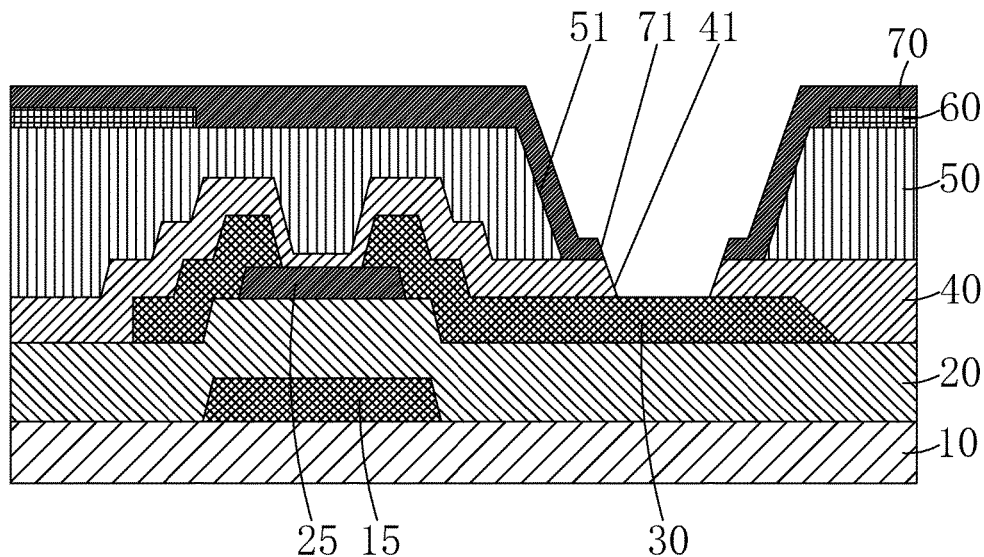

Preferably, the step 3 further comprises: implementing anneal process to the common electrode 60 to heat, solidify and crystallize the transparent conductive metal oxide therein, and thus to improve the film structure of the common electrode 60, and to decrease the square resistance to make the structure more stable, and the lifetime longer.

step 4, as shown in FIG. 5, forming a second passivation layer 70 on the common electrode 60 and the flat layer 50, and the second passivation layer 70 covers the first via 51 and contact with the first passivation layer 40;

as shown in FIG. 6, implementing one photolithographic process for implementing via opening process to a portion of the second passivation layer 70 at a bottom of the first via 51 to obtain a second via 71 on the second passivation layer 70, and continuing etching the first passivation layer 40 along the second via 71 to obtain a third via 41 corresponding to the second via 71.

Materials and film thicknesses of the first passivation layer 40 and the second passivation layer 70 are the same, and then, the under cut issue due to the different material in the etching process can be reduced.

Specifically, the first passivation layer 40 and the second passivation layer 70 can be silicon oxide layers ($SiO_x$), silicon nitride layers ($SiN_x$) or composite layers superimposed with the silicon oxide layers and the silicon nitride layers.

Preferably, the film thicknesses of the first passivation layer 40 and the second passivation layer 70 are 1500-2500 Å.

Specifically, sizes of the second via 71 and the third via 41 are smaller than a size of the first via 51.

Preferably, all the first via 51, the second via 71 and the third via 41 are circular holes, and a diameter of the first via 51 is 7-12 μm, and diameters of the second via 71 and the third via 41 are 3-5 μm.

Figure 7:
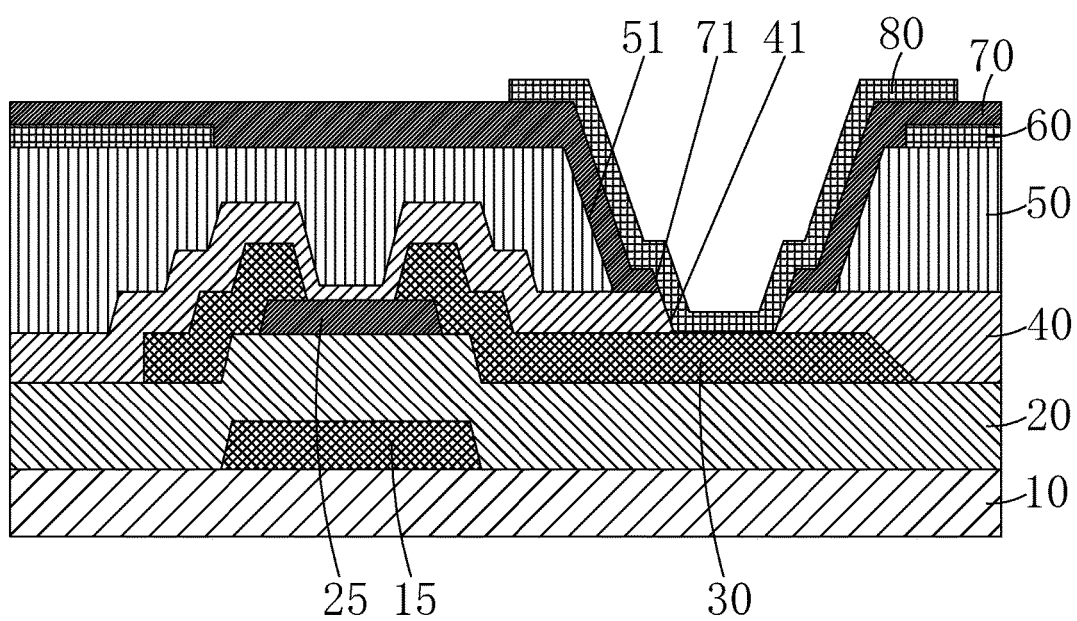
FIG. 7 is a diagram of the step 5 of a manufacture method of an array substrate according to the present invention and a structure diagram of an array substrate manufactured by the method according to the present invention.

Specifically, in the step 4, both the etching process in the photolithographic process of the second passivation layer 70 and the etching process of the first passivation layer 40 are dry etching processes. The step 4 employs one mask to achieve the via opening process to the first passivation layer 40 and the second passivation layer 70. In comparison with prior art, one mask can be eliminated to save the production cost and to reduce the process time.

step 5, as shown in FIG. 7, depositing a second transparent conductive layer on the second passivation layer 70, and patterning to the second transparent conductive layer to form a pixel electrode 80, and the pixel electrode 80 contacts with the source/the drain 30 through the second via 71 and the third via 41.

Specifically, material of the pixel electrode 80 is transparent conductive metal oxide, such as Indium Tin Oxide (ITO).

Preferably, the step 5 further comprises: implementing anneal process to the pixel electrode 80 to heat, solidify and crystallize the transparent conductive metal oxide therein, and thus to improve the film structure of the pixel electrode 80, and to decrease the square resistance to make the structure more stable, and the lifetime longer.

Please refer to FIG. 7. The present invention further provides an array substrate, comprising a substrate 10, a gate 15 located on the substrate 10, a gate isolation layer 20 located on the gate 15 and the substrate 10, and an active layer 25 located on the gate isolation layer 20, a source/a drain 30 located on the active layer 25 and the gate isolation layer 20, a first passivation layer 40 located on the source/the drain 30, the active layer 25 and the gate isolation layer 20, a flat layer 50 located on the first passivation layer 40, a common electrode 60 located on the flat layer 50, a second passivation layer 70 located on the common electrode 60 and the flat layer 50, and a pixel electrode 80 located on the second passivation layer 70.

a first via 51 located on the flat layer 50 correspondingly above the source/the drain 30, a second via 71 located on the second passivation layer 71 on a bottom portion of the first via 51, a third via 41 located on the first passivation layer 40 communicating with the second via 71, and the pixel electrode 80 contacts with the source/the drain 30 through the second via 71 and the third via 41.

Specifically, the substrate 10 is a transparent substrate, and preferably is a glass substrate.

Specifically, material of the gate 15, the source/the drain 30 can be a stack combination of one or more of molybdenum (Mo), titanium (Ti), aluminum (Al) and copper (Cu). Material of the source/the drain 30 is preferably to be copper.

Specifically, the gate isolation layer 20 can be silicon oxide layers ($SiO_x$), silicon nitride layers ($SiN_x$) or composite layers superimposed with the silicon oxide layers and the silicon nitride layers.

Specifically, material of the active layer 25 is IGZO (Indium Gallium Zinc Oxide).

Specifically, material of the flat layer 50 is positive photoresist.

Specifically, material of the common electrode 60 and the pixel electrode 80 is transparent conductive metal oxide, such as Indium Tin Oxide (ITO).

Preferably, materials and film thicknesses of the first passivation layer 40 and the second passivation layer 70 are the same.

Specifically, the first passivation layer 40 and the second passivation layer 70 can be silicon oxide layers ($SiO_x$), silicon nitride layers ($SiN_x$) or composite layers superimposed with the silicon oxide layers and the silicon nitride layers.

Preferably, the film thicknesses of the first passivation layer 40 and the second passivation layer 70 are 1500-2500 Å.

Specifically, sizes of the second via 71 and the third via 41 are smaller than a size of the first via 51.

Preferably, all the first via 51, the second via 71 and the third via 41 are circular holes, and a diameter of the first via 51 is 7-12 μm, and diameters of the second via 71 and the third via 41 are 3-5 μm.

In conclusion, the present invention provides a manufacture method of an array substrate. By sequentially forming the first passivation layer and the flat layer, and then implementing patterning process and anneal process to the flat layer, in the anneal process to the flat layer, the flat layer and the source/the drain cannot contact with each other due to the first passivation layer inbetween, and Thus, no reaction of generating complex happens, which is beneficial for promoting the electrical property of the array substrate and realizing the signal conduction; in comparison with the manufacture of the array substrate according to prior art, the present invention can decrease at least one mask in advance, which is a advantage to raise the process result, to decrease the process time and to reduce the production cost. In the array substrate manufactured by the method according to the present invention, the signal transmission is smooth, and the substrate possesses the great electrical property.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an array substrate, comprising steps of:
    step 1, providing a substrate, and sequentially forming a gate, a gate isolation layer, an active layer and a source/a drain on the substrate;
    step 2, forming a first passivation layer on the source/the drain and the gate isolation layer, and forming a flat layer on the first passivation layer, and patterning the flat layer to obtain a first via above the source/the drain;
    step 3, depositing a first transparent conductive layer on the flat layer, and patterning the first transparent conductive layer to form a common electrode;
    step 4, forming a second passivation layer on the common electrode and the flat layer, and the second passivation layer covers the first via and contact with the first passivation layer;
    implementing via opening process to a portion of the second passivation layer at a bottom of the first via to obtain a second via on the second passivation layer, and continuing etching the first passivation layer along the second via to obtain a third via corresponding to the second via, wherein one mask is used to carry out etching of both the first passivation layer and the second passivation layer;
    step 5, depositing a second transparent conductive layer on the second passivation layer, and patterning to the second transparent conductive layer to form a pixel electrode, and the pixel electrode contacts with the source/the drain through the second via and the third via.

2. The manufacture method of the array substrate according to claim 1, wherein materials and film thicknesses of the first passivation layer and the second passivation layer are the same.

3. The manufacture method of the array substrate according to claim 2, wherein the first passivation layer and the second passivation layer are Silicon Oxide layers, Silicon Nitride layers or composite layers superimposed with Silicon Oxide layers and Silicon Nitride layers; film thicknesses of the first passivation layer and the second passivation layer are 1500-2500 Å.

4. The manufacture method of the array substrate according to claim 1, wherein sizes of the second via and the third via are smaller than a size of the first via.

5. The manufacture method of the array substrate according to claim 4, wherein all the first via, the second via and the third via are circular holes, and a diameter of the first via is 7-12 μm, and diameters of the second via and the third via are 3-5 μm.

* * * * *